United States Patent
Narita

(10) Patent No.: US 9,839,169 B2
(45) Date of Patent: Dec. 5, 2017

(54) PRINTED BOARD TRANSPORT APPARATUS

(71) Applicant: YAMAHA HATSUDOKI KABUSHIKI KAISHA, Shizuoka (JP)

(72) Inventor: Yoshitaka Narita, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 0 days.

(21) Appl. No.: 15/302,366

(22) PCT Filed: Apr. 7, 2014

(86) PCT No.: PCT/JP2014/060079
§ 371 (c)(1),
(2) Date: Oct. 6, 2016

(87) PCT Pub. No.: WO2015/155817
PCT Pub. Date: Oct. 15, 2015

(65) Prior Publication Data
US 2017/0034966 A1 Feb. 2, 2017

(51) Int. Cl.
*B65G 43/00* (2006.01)
*H05K 13/00* (2006.01)
*H05K 13/02* (2006.01)

(52) U.S. Cl.
CPC ....... *H05K 13/0061* (2013.01); *H05K 13/021* (2013.01)

(58) Field of Classification Search
CPC ...... B65G 47/52; B65G 37/005; B65G 21/12; H05K 13/0061; H05K 13/021
(Continued)

(56) References Cited

U.S. PATENT DOCUMENTS 5,692,292 A * 12/1997 Asai ............ H05K 13/0061
198/341.04
6,324,752 B1 * 12/2001 Wesseling ...... H05K 13/0061
29/564
(Continued)

FOREIGN PATENT DOCUMENTS

JP H08-204387 A 8/1996
JP 2007-184648 A 7/2007
(Continued)

OTHER PUBLICATIONS

International Search Report issued in PCT/JP2014/060079; dated Jul. 1, 2014.

Primary Examiner — William R Harp
(74) Attorney, Agent, or Firm — Studebaker & Brackett PC

(57) ABSTRACT

A printed board transport apparatus includes a first conveyor which transports a printed board between a working portion and printed board loading/unloading portions of a working apparatus, and a second conveyor installed in the printed board loading/unloading portions. The first conveyor has a function of rotating a first transport member, and a function of moving in a direction parallel to the transport direction. The second conveyor transports the printed board by rotating a second transport member. After the length of a downstream portion of the printed board, which is placed on a conveyor on the downstream side, has reached a support length, the first conveyor moves toward the working portion by changing the rotational speed of the first transport member to a rotational speed for conveyor movement.

5 Claims, 11 Drawing Sheets

(58) Field of Classification Search
USPC .................................................. 198/571, 586
See application file for complete search history.

(56) References Cited

U.S. PATENT DOCUMENTS

| | | | | |
|---|---|---|---|---|
| 6,892,446 | B2 * | 5/2005 | Hwang | H05K 13/0061 198/346.1 |
| 6,988,612 | B1 * | 1/2006 | Kabeshita | H05K 13/0061 198/369.1 |
| 8,376,129 | B2 * | 2/2013 | Kimura | H05K 13/0452 198/836.3 |

FOREIGN PATENT DOCUMENTS

| | | |
|---|---|---|
| JP | 2010-050401 A | 3/2010 |
| JP | 2010-087136 A | 4/2010 |

\* cited by examiner

PRINTED BOARD TRANSPORT APPARATUS

CROSS REFERENCE TO RELATED APPLICATIONS

This application claims benefit of priority to International Patent Application No. PCT/JP2014/060079 filed Apr. 7, 2014, the entire content of which is incorporated herein by reference.

TECHNICAL FIELD

The present disclosure relates to a printed board transport apparatus. More specifically, the present disclosure relates to a printed board transport apparatus including a conveyor having a function of transporting a printed board, and a function of moving in the transport direction.

BACKGROUND

Conventionally, a working apparatus for performing work on a printed board includes a conveyor for transporting the printed board. A printed board to be loaded into this working apparatus is placed on a loading conveyor by an apparatus in a preceding step, and transferred from the downstream end of this loading conveyor to a conveyor in the working apparatus. The printed board having undergone work by the working apparatus is transported to the downstream side in the transport direction by the conveyor in the working apparatus, and transferred from the downstream end of this conveyor to an unloading conveyor. An example of the conventional printed board transport apparatus configured as described above is described in Japanese Patent Laid-Open No. 2007-184648.

The printed board transport apparatus disclosed in Japanese Patent Laid-Open No. 2007-184648 is installed in a surface mounter. This transport apparatus includes a movable conveyor which moves in a printed board transport direction in the surface mounter. A printed board to be loaded into this surface mounter is transferred from a loading conveyor on the upstream side to the movable conveyor having moved to the upstream side in the transport direction. After the whole printed board has been transferred onto the movable conveyor, the movable conveyor moves to the downstream side in the transport direction, and stops in a working position.

The printed board on which an electronic part is mounted is transferred to an unloading conveyor from the movable conveyor having moved to the downstream side in the transport direction. After the whole printed board has been transferred to the unloading conveyor, the movable conveyor moves to the upstream side in the transport direction.

The printed board transport apparatus including the movable conveyor is installed not only in the surface mounter as disclosed in Japanese Patent Laid-Open No. 2007-184648, but also in a screen printer which coats a printed board with solder paste.

When sequentially performing work on a plurality of printed boards in the conventional surface mounter or screen printer, it is required to further shorten the takt time from loading of one printed board to loading of a next printed board.

DISCLOSURE OF DISCLOSURE

Problem to be Solved by the Disclosure

In the printed board transport apparatus disclosed in Japanese Patent Laid-Open No. 2007-184648, the takt time can be shortened by increasing the transport speed of a printed board or the moving velocity of the movable conveyor. However, if a printed board moves at a high speed, the leading edge of the printed board may be damaged by impact when the printed board stops. When transporting a printed board on which an electronic part is mounted, this electronic part on the printed board moves due to impact when the board stops. Accordingly, the printed board transport apparatus disclosed in Japanese Patent Laid-Open No. 2007-184648 cannot meet the demand for further shortening the takt time.

The present disclosure has been made to meet this demand, and has as its object to provide a printed board transport apparatus capable of shortening the takt time while decreasing the transport speed and the moving velocity of a conveyor.

Means of Solution to the Problem

To achieve this object, a printed board transport apparatus according to the present disclosure comprises a first conveyor installed in a working apparatus for performing work on a printed board, and configured to transport the printed board between a working portion where the working apparatus performs work on the printed board and a printed board loading/unloading portion of the working apparatus, and a second conveyor configured to transport the printed board to the first conveyor in a loading step of loading the printed board into the working apparatus through the printed board loading/unloading portion, and receive the printed board from the first conveyor in an unloading step of unloading the printed board from the working apparatus through the printed board loading/unloading portion. The first conveyor includes a first transport member on which the printed board is to be placed, and transports the printed board by using both a function of transporting the printed board by rotating the first transport member, and a function of moving between the working portion and the printed board loading/unloading portion in a direction parallel to a transport direction of the printed board. The second conveyor includes a second transport member on which the printed board is to be placed, and transports the printed board by rotating the second transport member. The printed board is transferred from the second conveyor to the first conveyor in the loading step, when the first transport member and the second transport member rotate in the same direction at a predetermined rotational speed in a state in which the first conveyor has moved to and stopped at a position adjacent to the second conveyor. The printed board is transferred from the first conveyor to the second conveyor in the unloading step, when the first transport member and the second transport member rotate in the same direction at a predetermined rotational speed in a state in which the first conveyor has moved to and stopped at a position adjacent to the second conveyor. The first conveyor moves toward the working portion in at least one of the loading step and the unloading step by changing a rotational speed of the first transport member from a rotation speed at a transfer start timing to a predetermined rotational speed for conveyor movement, after a length of a downstream portion of the printed board, which is placed on one of the first conveyor and the second conveyor, which is positioned downstream in the transport direction, has reached a predetermined support length. The support length is a length of a minimum downstream portion with which the printed board placed on the one conveyor positioned downstream in the transport direction does not fall, and the rotational speed for conveyor movement is a rotational speed at which the printed board does not slip with respect to the first transport member and the second transport member.

Effect of the Disclosure

The first conveyor according to the present disclosure starts moving toward the working portion during the process in which a printed board is transferred between conveyors. Even when the first conveyor thus moves during the process in which a printed board is transferred between conveyors, the printed board does not fall from a conveyor on the downstream side for the following two reasons. The first reason is that the printed board is supported by the conveyor on the downstream side in the transport direction. The second reason is that the printed board does not slip with respect to the conveyor on the downstream side because the rotational speed of the first transport member has changed.

Accordingly, when compared to a case in which the first conveyor starts moving after the whole printed board has been transferred to the downstream conveyor, the takt time can be shortened because the waiting time of the first conveyor is short. Therefore, the present disclosure can provide a printed board transport apparatus capable of shortening the takt time without largely changing the transport speed and the moving velocity of a conveyor.

DETAILED DESCRIPTION

Best Mode for Carrying Out the Disclosure (Basic Configuration of Present Disclosure)

First, the basic configuration of a printed board transport apparatus according to the present disclosure will be explained with reference to FIGS. 1 to 8.

Figure 1:
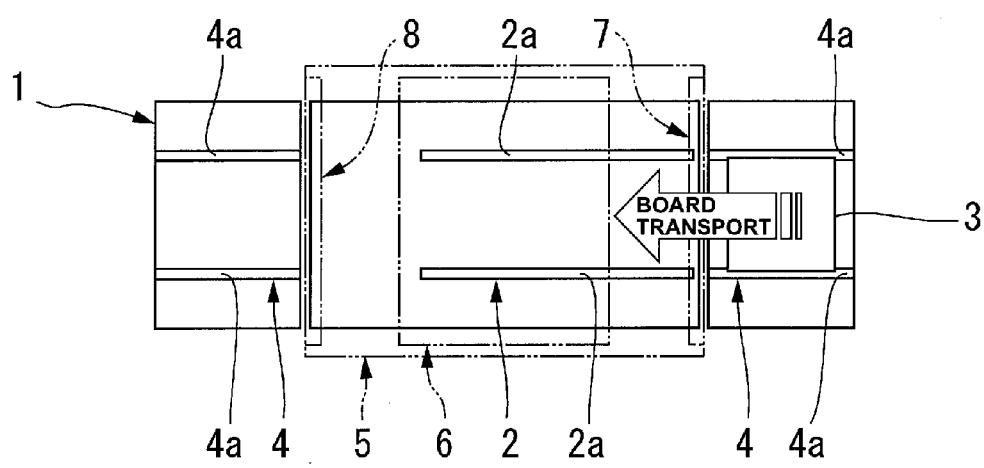
FIG. 1 is a plan view for explaining the basic configuration of the present disclosure, and depicts a state in which a first conveyor has moved to a loading position.

A printed board transport apparatus 1 shown in FIG. 1 includes a first conveyor 2, and a second conveyor 4 which transports a printed board 3 together with the first conveyor 2. The first conveyor 2 is installed in a working apparatus 5 for performing work on the printed board 3. The first conveyor 2 transports the printed board 3 between a working portion 6 in which the working apparatus 5 performs work on the printed board 3, and printed board loading/unloading portions of the working apparatus 5. The printed board loading/unloading portions according to this embodiment include a loading portion 7 positioned in one end portion of the working apparatus 5, and an unloading portion 8 positioned in the other end portion.

The printed board transport apparatus 1 shown in FIG. 1 includes the second conveyor 4 on each of the loading portion 7 side and unloading portion 8 side.

Figure 2:
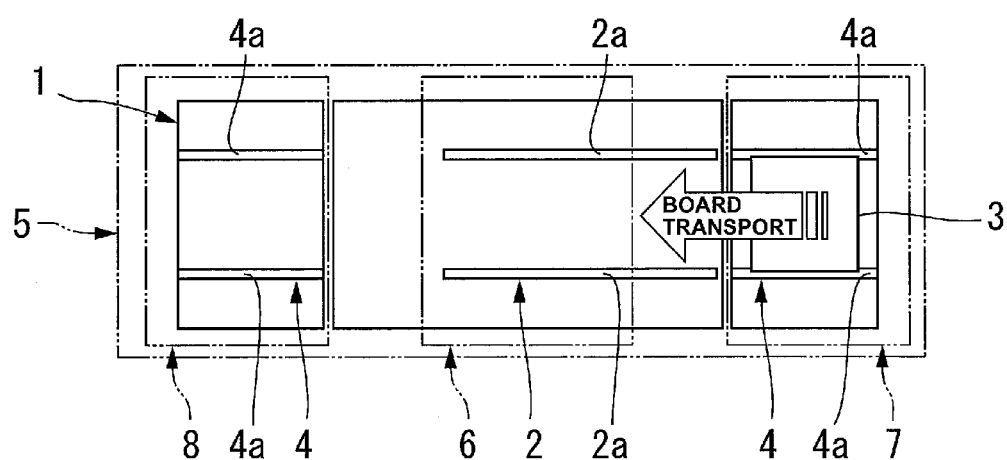
FIG. 2 is a plan view for explaining the basic configuration of the present disclosure, and shows an example of a case in which a second conveyor is installed in a working apparatus.

In this embodiment, the second conveyor 4 positioned on the loading portion 7 side and the second conveyor 4 positioned on the unloading portion 8 side are installed outside the working apparatus 5. The second conveyor 4 positioned on the loading portion 7 side according to this embodiment connects the working apparatus 5 and an apparatus in a preceding step. The second conveyor 4 positioned on the unloading portion 8 side according to this embodiment connects the working apparatus 5 to an apparatus in a succeeding step. Note that the printed board transport apparatus 1 according to the present disclosure is not limited to this. As shown in FIG. 2, the second conveyor 4 on the loading portion 7 side and the second conveyor 4 on the unloading portion 8 side can also be installed in the working apparatus 5.

The printed board transport apparatus shown in FIG. 1 transports the printed board 3 from the second conveyor 4 positioned on the loading portion 7 side to the second conveyor 4 positioned on the unloading portion 8 side. The working apparatus 5 performs work on the printed board 3 placed on the first conveyor 2. Although not shown, the working apparatus 5 is a surface mounter, screen printer, or the like. The surface mounter mounts an electronic part on a printed board. The screen printer coats a printed board with solder paste.

A step of transporting the printed board 3 from the second conveyor 4 positioned on the loading portion 7 side to the first conveyor 2 will be called a loading step hereinafter. The second conveyor 4 positioned on the loading portion 7 side receives the printed board 3 from the apparatus in the preceding step, and transports the printed board 3 to the first conveyor 2.

Also, a step of transporting the printed board 3 from the first conveyor 2 to the second conveyor 4 positioned on the unloading portion 8 side will be called an unloading step hereinafter. The second conveyor 4 positioned on the unloading portion 8 side receives the printed board 3 from the first conveyor 2, and transports the printed board 3 to the apparatus in the succeeding step.

The first conveyor 2 includes a first transport member 2a on which the printed board 3 is placed. The first transport member 2a according to this embodiment is formed by a belt. The first conveyor 2 transports the printed board 3 by using both a function of transporting the printed board 3 by rotating the first transport member 2a, and a function of moving in a direction parallel to the transport direction of the printed board 3 between the working portion 6 and the loading portion 7 or unloading portion 8.

The second conveyor 4 includes a second transport member 4a on which the printed board 3 is placed. The second transport member 4a according to this embodiment is formed by a belt. The second conveyor 4 transports the printed board 3 by rotating the second transport member 4a.

Figure 3:
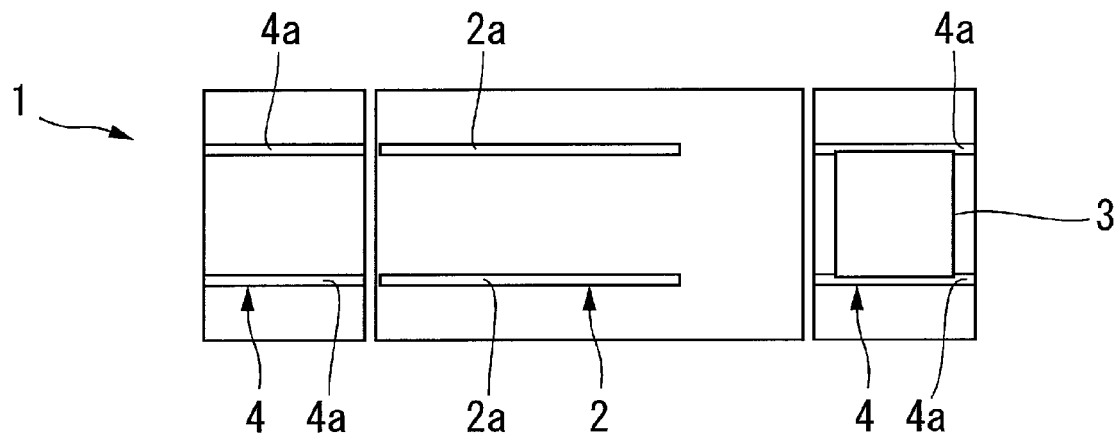
FIG. 3 is a plan view for explaining the basic configuration of the present disclosure, and depicts a state in which the first conveyor has moved to an unloading position.

The moving range of the first conveyor 2 is a range between a loading position shown in FIG. 1 and an unloading position shown in FIG. 3. The loading position is the position of the first conveyor 2 where the printed board 3 can be transferred from the second conveyor 4 of the loading portion 7 to the first conveyor 2. The unloading position is the position of the first conveyor 2 where the printed board 3 can be transferred from the first conveyor 2 to the second conveyor 4 of the unloading portion 8.

In the loading step, the printed board 3 is transferred from the second conveyor 4 to the first conveyor 2 when the first transport member 2a and second transport member 4a rotate in the same direction at a predetermined rotational speed in a state in which the first conveyor 2 has moved to and stopped at a position adjacent to the second conveyor 4.

Also, in the unloading step, the printed board 3 is transferred from the first conveyor 2 to the second conveyor 4 when the first transport member 2a and second transport member 4a rotate in the same direction at a predetermined rotational speed in a state in which the first conveyor 2 has moved to and stopped at a position adjacent to the second conveyor 4.

In the loading step and unloading step, the first conveyor 2 according to this embodiment moves toward the working portion 6 by changing the rotational speed of the first transport member 2a from a rotational speed at the transfer start timing to a predetermined rotational speed for conveyor movement, after a predetermined timing is reached. The predetermined timing herein mentioned is a timing at which the length of a downstream portion 3a (see FIGS. 4 and 7) of the printed board 3, which is placed on one of the first conveyor 2 and second conveyor 4, which is positioned downstream in the transport direction, has reached a predetermined support length.

The predetermined support length is the length of a minimum downstream portion 3a with which the printed board 3 placed on one conveyor positioned downstream in the transport direction does not fall.

The rotational speed for movement is a rotational speed at which the printed board 3 does not slip with respect to the first transport member 2a and second transport member 4a. The rotational speed like this can be, e.g., a rotational speed at which the speed of the printed board 3 which advances with respect to the working apparatus 5 by the movement of the first conveyor 2 and the rotation of the first transport member 2a matches the transport speed of the second conveyor 4.

(Explanation of Loading Step)

Figure 4:
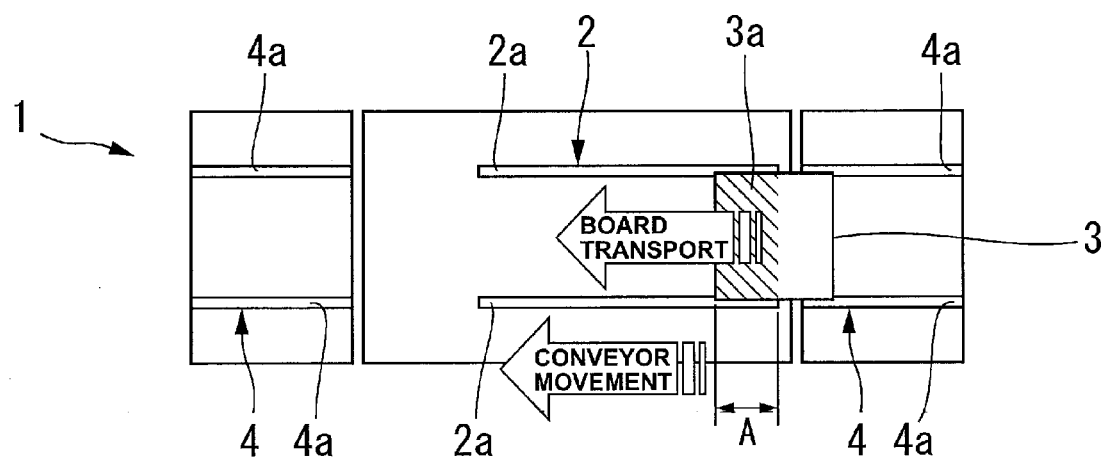
FIG. 4 is a plan view for explaining a loading step.

In the loading step, as shown in FIG. 4, the first conveyor 2 starts moving after a length A of the downstream portion 3a of the printed board 3, which is placed on the first conveyor 2, has reached the predetermined support length. FIG. 4 shows the downstream portion 3a as a hatched portion. The support length is set for each printed board 3 based on, e.g., the length and weight distribution of the printed board 3, and the presence/absence of a mounted part.

Figure 5:
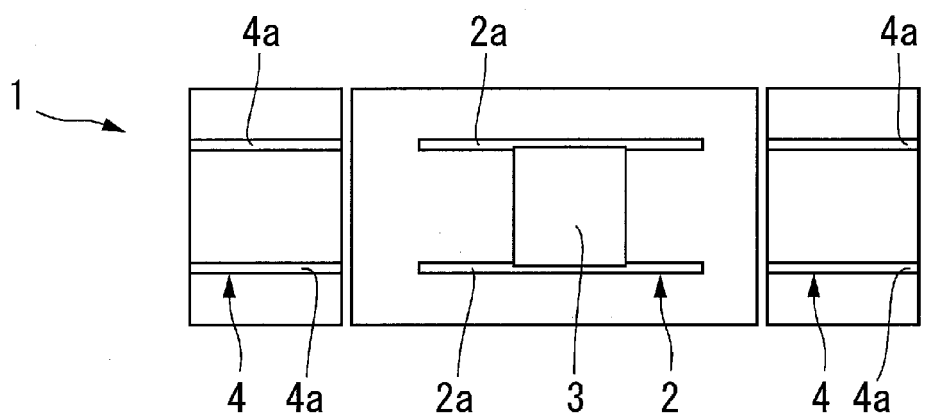
FIG. 5 is a plan view showing a state when the loading step is complete.

In the loading step, the first conveyor 2 moves to the downstream side in the transport direction, and stops at a working position shown in FIG. 5. In this working position, the working apparatus 5 fixes the printed board 3 to the first conveyor 2 and performs work.

When moving to the working position as described above, the first conveyor 2 changes the rotational speed of the first transport member 2a to the above-described rotational speed for movement. In the loading step, the rotational speed of the first transport member 2a can be made lower than that when the printed board 3 starts transferring between conveyors. Also, the value of the ratio (acceleration) at which the rotational speed changes is set at a value corresponding to the acceleration when the first conveyor 2 starts moving.

Since the rotational speed of the first transport member 2a thus changes, the transport speed of the printed board 3 with respect to the working apparatus 5 does not change even when the first conveyor 2 moves to the downstream side in the transport direction. That is, it is possible to avoid the inconvenience that the printed board 3 slips with respect to the first conveyor 2 or second conveyor 4 and moves to an unexpected position.

The first conveyor 2 stops at the working position shown in FIG. 5 in a state in which the transport speed of the printed board 3 has decreased. At the same time the first conveyor 2 stops or before or after this stop, the printed board 3 is transported by the rotation of the first transport member 2a and positioned in a central portion of the first conveyor 2.

(Explanation of Unloading Step)

Figure 6:
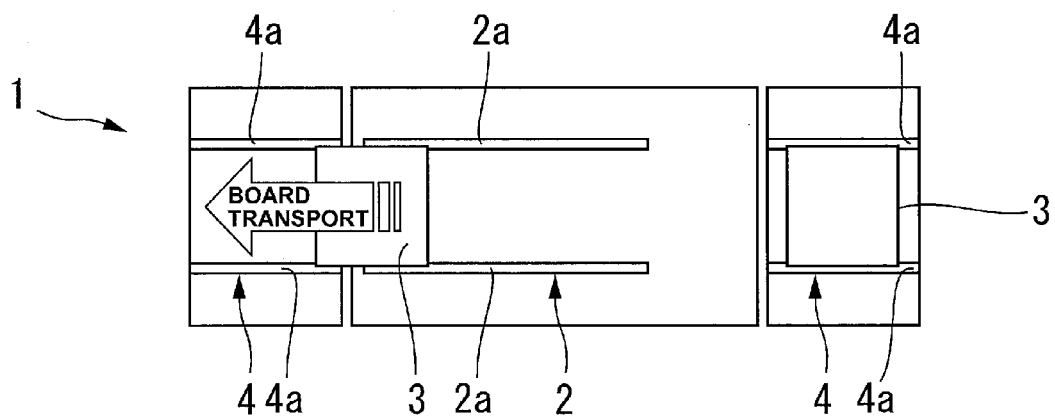
FIG. 6 is a plan view showing a state when unloading is started.
Figure 7:
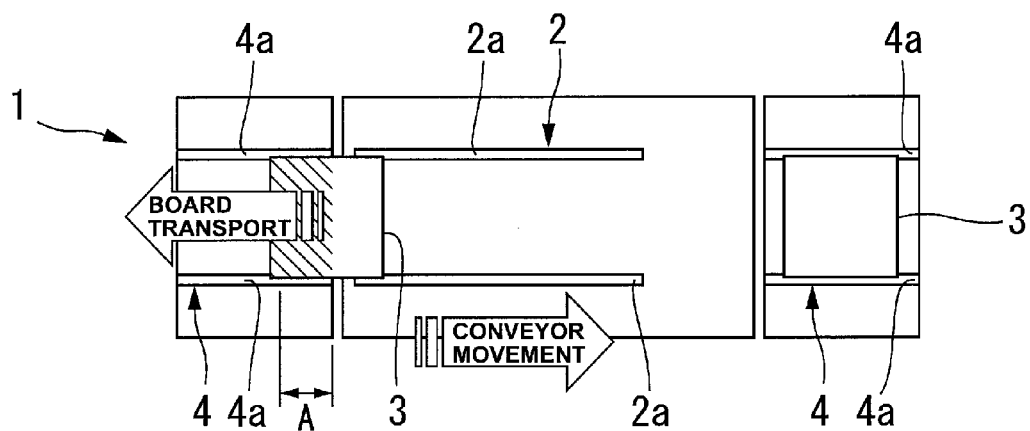
FIG. 7 is a plan view for explaining an unloading step.

As shown in FIG. 6, the first conveyor 2 moves to the unloading position after the work is performed on the printed board 3 by the working apparatus 5. In synchronism with this movement of the first conveyor 2, the first transport member 2a rotates and transports the printed board 3 to the downstream side in the transport direction. FIG. 6 shows a state in which the downstream portion 3a of the printed board 3 has been transferred to the second conveyor 4 on the downstream side. In the unloading step, the printed board 3 is transferred from the first conveyor 2 to the second conveyor 4 of the unloading portion 8.

The first conveyor 2 starts moving toward the working portion 6 after the length A of the downstream portion 3a of the printed board 3, which is placed on the second conveyor 4, has reached the predetermined support length, in the unloading step as well.

Figure 8:
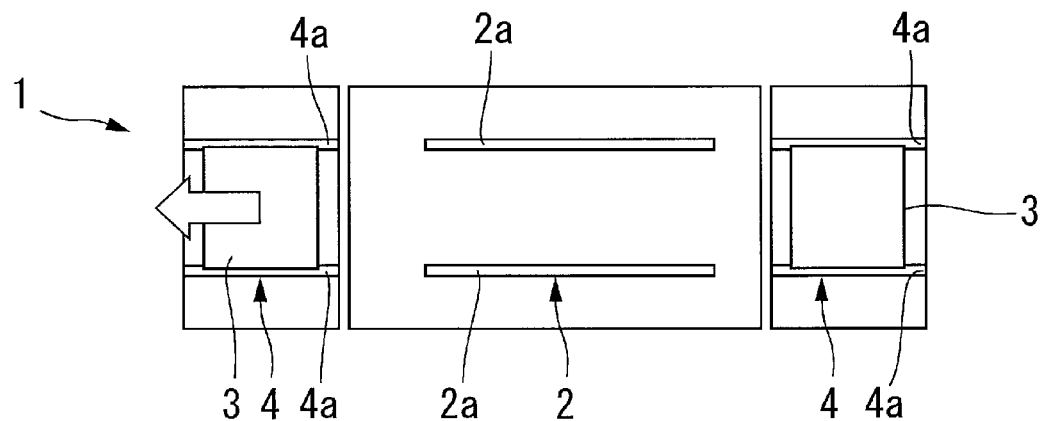
FIG. 8 is a plan view showing a state when the unloading step is complete.

The rotational speed of the first transport member 2a is changed to the above-described rotational speed for movement, when the first conveyor 2 moves in the unloading step as well. In this case, the rotational speed of the first transport member 2a can be made higher than that when the printed board 3 starts transferring between conveyors. Also, the value of the ratio (acceleration) at which the rotational speed changes is set at a value corresponding to the acceleration when the first conveyor 2 starts moving. As shown in FIG. 8, even after the whole printed board 3 has been transferred to the second conveyor 4 of the unloading portion 8, the first conveyor 2 keeps moving and returns to the working portion 6.

In the printed board transport apparatus 1 configured as described above, the first conveyor 2 starts moving during the process in which the printed board 3 is transferred between conveyors. Even when the first conveyor 2 moves during this transfer process, the printed board 3 does not fall from a conveyor on the downstream side for the following two reasons.

The first reason is that the printed board 3 is supported by a conveyor positioned downstream in the transport direction. The second reason is that the printed board 3 does not slip with respect to the conveyor on the downstream side because the rotational speed of the first transport member 2a changes. The rotational speed of the first transport member 2a can be decreased in the loading step in which the first conveyor 2 is positioned downstream of the second conveyor 4 in the transport direction, and increased in the unloading step in which the first conveyor 2 is positioned upstream of the second conveyor 4 in the transport direction.

Accordingly, when compared to a case in which the first conveyor 2 starts moving after the whole printed board 3 has been transferred, the takt time can be shortened because the waiting time of the first conveyor 2 is short. Therefore, this embodiment can provide a printed board transport apparatus capable of shortening the takt time without largely changing the transport speed or the conveyor moving velocity.

(Practical Configuration of Present Disclosure)

A practical configuration of the present disclosure will be explained in detail with reference to FIGS. 9 to 14. The same reference numerals as in FIGS. 1 to 8 denote the same or similar members in FIGS. 9 to 14, and a detailed explanation thereof will properly be omitted.

Figure 9:
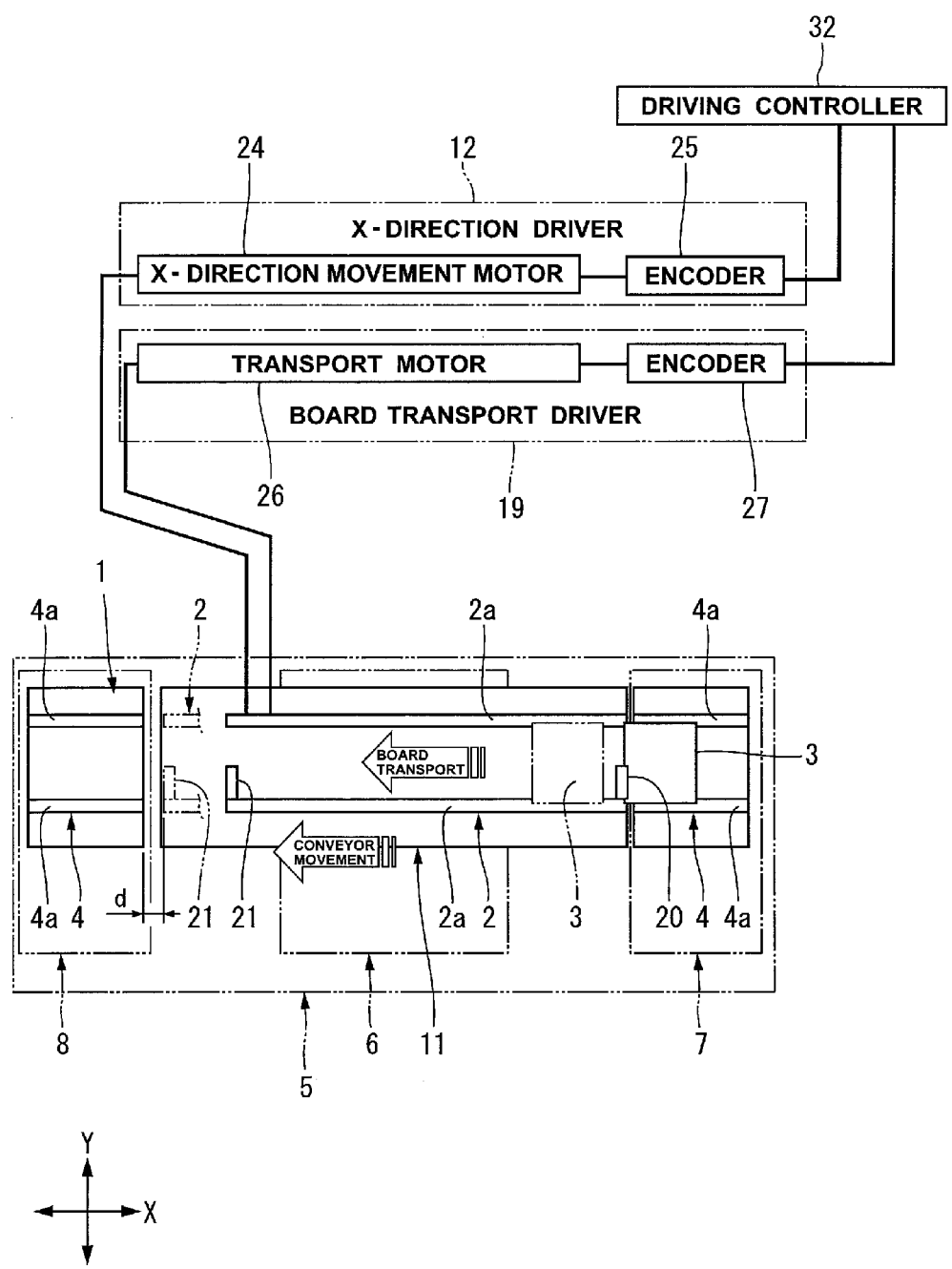
FIG. 9 is a plan view for explaining a practical arrangement of the present disclosure, and depicts a part of a control system.
Figure 10:
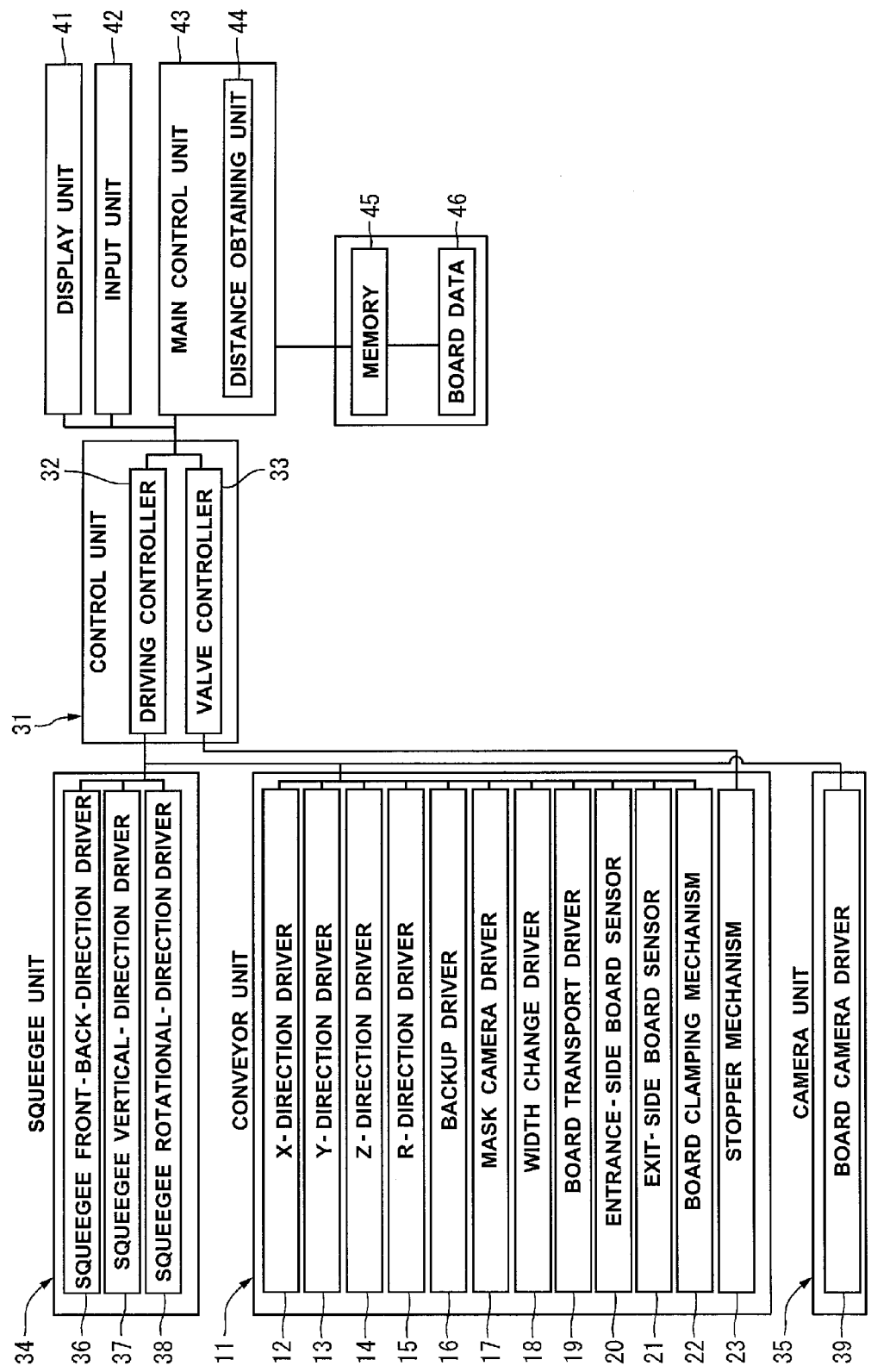
FIG. 10 is a block diagram showing the configuration of a control system of a screen printer.

A printed board transport apparatus 1 shown in FIG. 9 is incorporated into a screen printer (not shown). A first conveyor 2 of the printed board transport apparatus 1 forms a part of a conveyor unit 11 installed in the screen printer. As shown in FIG. 10, the conveyor unit 11 includes an X-direction driver 12, a Y-direction driver 13, a Z-direction driver 14, an R-direction driver 15, a backup driver 16, a mask camera driver 17, a width change driver 18, a board transport driver 19, an entrance-side board sensor 20, an exit-side board sensor 21, a board clamping mechanism 22, and a stopper mechanism 23. The X direction is the transport direction of a printed board 3. The Y direction is a horizontal direction perpendicular to the X direction. The Z direction is a vertical direction.

The X-direction driver 12 drives the first conveyor 2 in the X direction together with the conveyor unit 11. As shown in FIG. 9, the X-direction driver 12 includes an X-direction movement motor 24 and an encoder 25.

The Y-direction driver 13 drives the first conveyor 2 in the Y direction together with the conveyor unit 11.

The Z-direction driver 14 drives the first conveyor 2 in the Z direction together with the conveyor unit 11.

The R-direction driver 15 drives the first conveyor 2 in the R direction together with the conveyor unit 11. The R direction is a rotational direction around the conveyor center, for which the vertical direction is the rotation axis.

The backup driver 16 drives a backup mechanism (not shown) for supporting the printed board 3 so as to be spaced apart upward from the first conveyor 2.

The mask camera driver 17 changes the imaging range of a mask camera (not shown) installed in the screen printer.

The width change driver 18 drives a width changing mechanism (not shown) for changing the transport width (Y-direction width) of the first conveyor 2.

The board transport driver 19 drives a first transport member 2a and a second transport member 4a. As shown in FIG. 9, the board transport driver 19 includes a transport motor 26 connected to the first transport member 2a, and an encoder 27. Note that the second transport member 4a is also connected to a dedicated transport motor although not shown.

As shown in FIG. 9, the entrance-side board sensor 20 is installed in an upstream-side end portion of the first conveyor 2. In a loading step, the entrance-side board sensor 20 senses a first transfer start timing, which is a timing at which the downstream edge of the printed board 3 in the transport direction moves onto the first conveyor 2.

As shown in FIG. 9, the exit-side board sensor 21 is installed in a downstream-side end portion of the first conveyor 2. In an unloading step, the exit-side board sensor 21 senses a second transfer start timing at which the downstream edge of the printed board 3 in the transport direction moves onto a second conveyor 4 on the unloading portion 8. In this embodiment, the entrance-side board sensor 20 and exit-side board sensor 21 form "a detection unit".

The board clamping mechanism 22 fixes the printed board 3 supported by the backup mechanism.

The stopper mechanism stops the printed board 3 transported by the first conveyor 2.

A control unit 31 (see FIG. 10) of the screen printer controls the operations of these drivers. As shown in FIG. 10, the control unit 31 includes a driving controller 32 and a valve controller 33. The driving controller 32 is connected to the various drivers and the sensors 20 and 21 described above, and to a squeegee unit 34 and a camera unit 35 to be describe below.

The squeegee unit 34 includes a squeegee (not shown) of this screen printer, and a squeegee front-back-direction driver 36, a squeegee vertical-direction driver 37, and a squeegee rotational-direction driver 38 for driving the squeegee.

The squeegee front-back-direction driver 36 drives the squeegee in the front-back direction (e.g., the X direction). The squeegee vertical-direction driver 37 vertically moves the squeegee. The squeegee rotational-direction driver 38 changes an angle (attack angle) between the squeegee and a mask during printing. The squeegee rotational-direction driver 38 rotates the squeegee around an axis extending in the left-right direction (e.g., the Y direction).

The camera unit 35 includes a camera (not shown) for capturing an image of the printed board 3, and a board camera driver 39 for driving the camera.

The valve controller 33 of the control unit 31 controls the operations of air valves (not shown) installed in the board clamping mechanism 22 and stopper mechanism 23.

A display unit 41, an input unit 42, and a main control unit 43 are connected to the control unit 31.

The main control unit 43 comprehensively controls the operations of the above-described driving controller 32 and valve controller 33. In this embodiment, the main control unit 43 is equivalent to "a control unit". The main control unit 43 includes a distance obtaining unit 44. The distance obtaining unit 44 obtains the moving distance of the printed board 3 transported by the first transport member 2a. The moving distance of the printed board 3 is obtained by an arithmetic operation by using the encoder 27 installed in the board transport driver 19.

Also, a memory 45 is connected to the main control unit 43. The memory 45 stores board data 46. The board data 46 is data such as the type and size of the printed board 3 to be used. The board data 46 also contains data of the support length of each printed board 3. The support length is the length of a downstream portion 3a of the printed board 3, which is placed on a conveyor on the downstream side, and is the length of a minimum downstream portion 3a with which the printed board 3 placed on only this downstream conveyor does not fall. The downstream conveyor herein mentioned is the first conveyor 2 in the loading step, and the second conveyor 4 positioned on the side of an unloading portion 8 in the unloading step.

The main control unit 43 starts controlling the movement of the first conveyor 2 after the length of the downstream portion 3a of the printed board 3, which is actually placed on the downstream conveyor, has reached the above-described support length. The main control unit 43 obtains the length of the downstream portion 3a based on the transport distance of the printed board 3, which is obtained by the distance obtaining unit 44. In the loading step, the first transfer start timing is the start timing of transport distance measurement. In the loading step, the length of the downstream portion 3a is equivalent to the transport distance of the printed board 3 from the first transfer start timing to the present time.

In the unloading step, the second transfer start timing is the start timing of transport distance measurement. In the unloading step, the length of the downstream portion 3a is a length obtained by subtracting a gap d (see FIG. 9) between the exit-side board sensor 21 and downstream-side second conveyor 4 from the transport distance of the printed board 3 from the second transfer start timing to the present time. FIG. 9 depicts the downstream end of the first conveyor 2 positioned in the unloading position by the alternate long and two short dashed line.

The operation of the first conveyor 2 after the length of the downstream portion 3a has reached the support length is the same as that of the first conveyor 2 shown in FIGS. 1 to 8.

Figure 11:
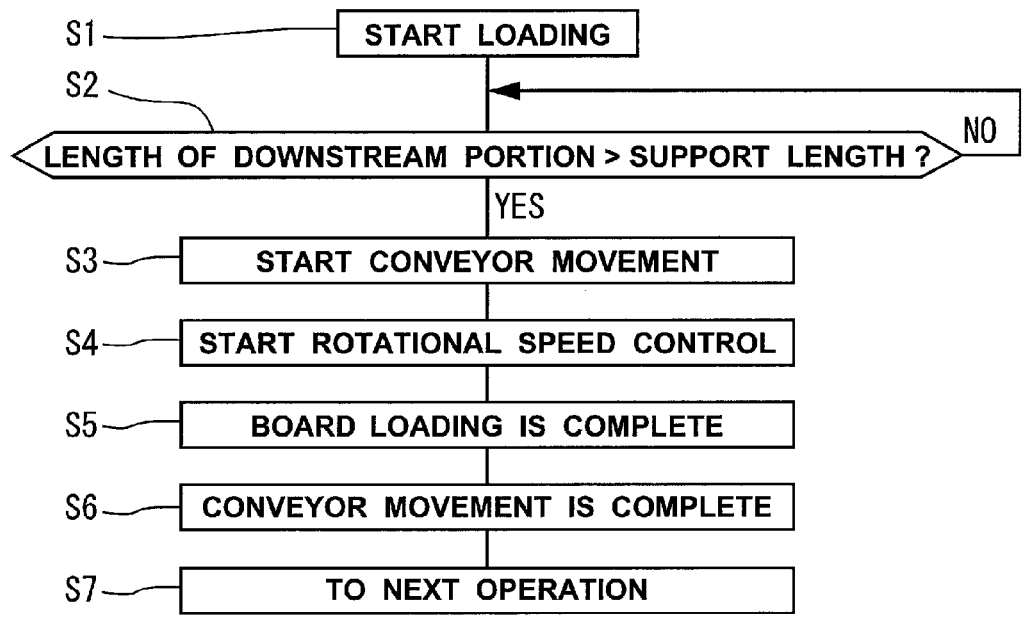
FIG. 11 is a flowchart for explaining the operation of loading.
Figure 13:
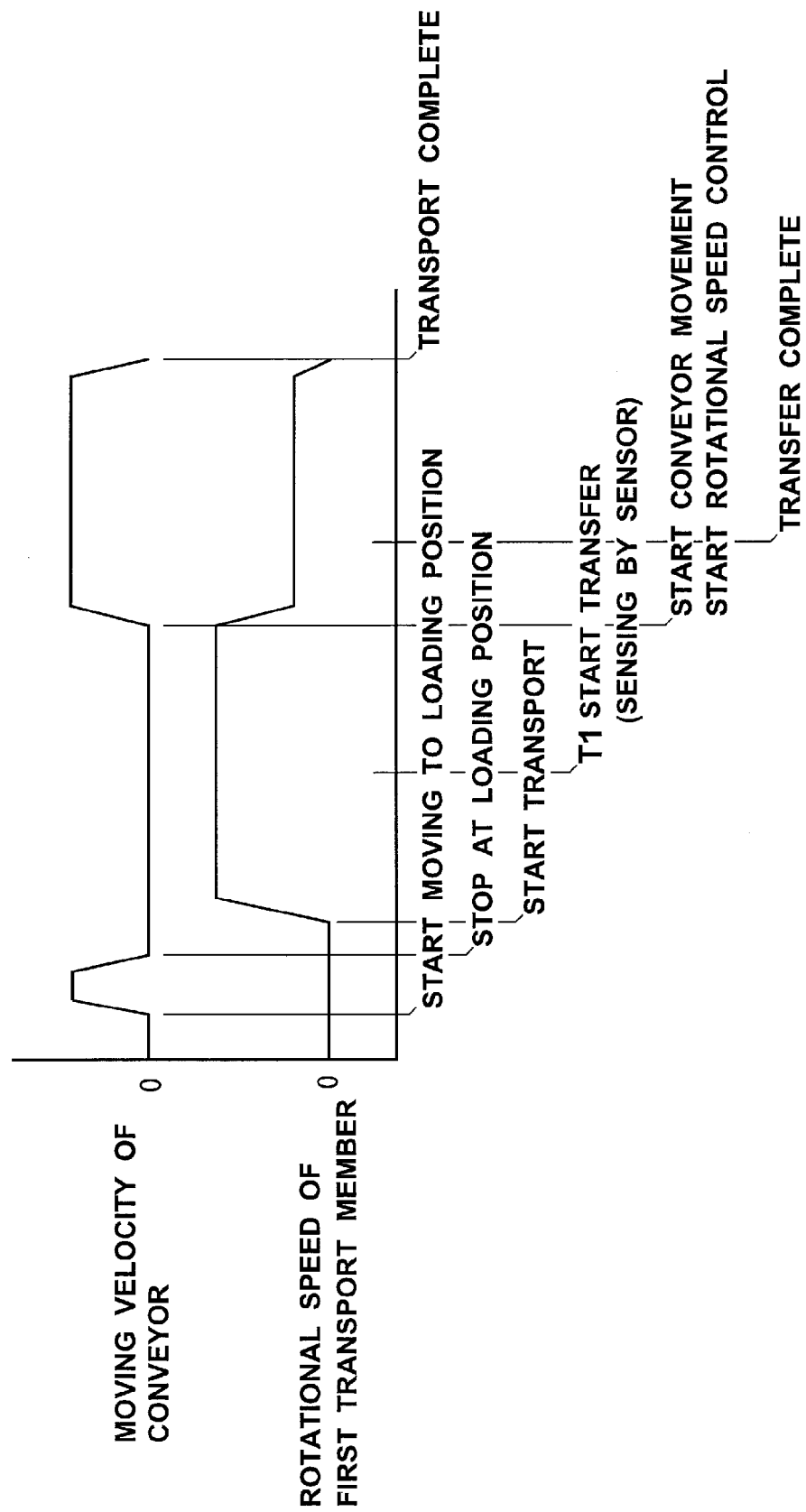
FIG. 13 is a timing chart for explaining the operation of loading.
Figure 14:
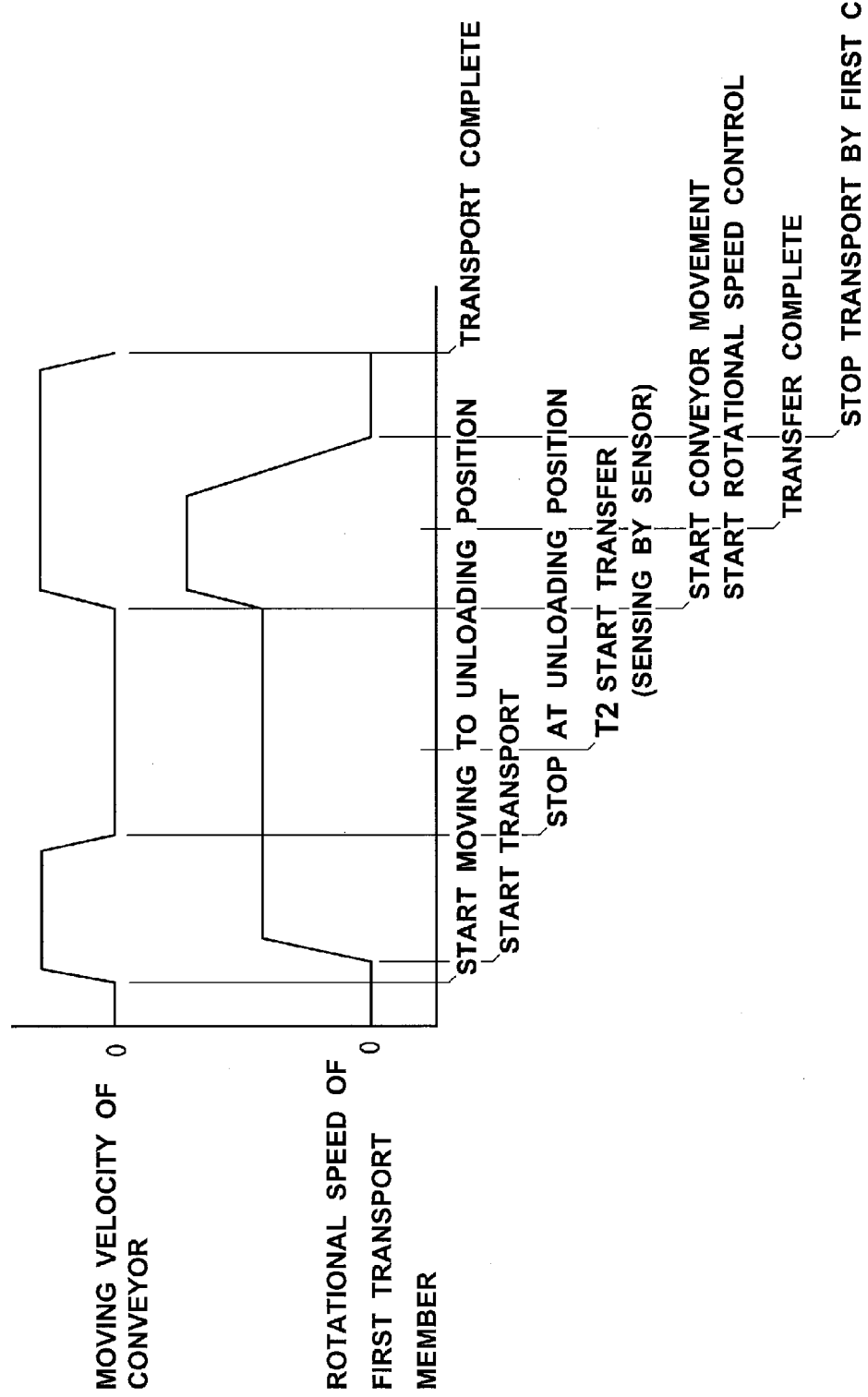
FIG. 14 is a timing chart for explaining the operation of unloading.

Next, the operation of the printed board transport apparatus 1 according to this embodiment will be explained with reference to flowcharts shown in FIGS. 11 and 12 and timing charts shown in FIGS. 13 and 14.

First, the operation of the loading step will be explained. In step S1 of the flowchart shown in FIG. 11, the first conveyor 2 moves to and stops at the loading position under the control of the main control unit 43. Then, as shown in FIG. 13, the first transport member 2a and second transport member 4a start a transport operation, thereby transporting the printed board 3 toward the first conveyor 2 from the second conveyor 4 on the unloading portion 7.

The downstream end of the printed board 3 in the transport direction moves onto the first conveyor 2 from the second conveyor 4. At the first transfer start timing denoted by reference symbol T1 in FIG. 13, the entrance-side board sensor 20 senses this downstream end, and transmits a signal to the main control unit 43.

The main control unit 43 obtains the transport distance of the printed board 3 from the first transfer start timing T1 to the present time. This transport distance is equivalent to the length of the downstream portion 3a of the printed board 3, which is actually placed on the first conveyor 2.

Subsequently, in step S2, the main control unit 43 determines whether the length of the downstream portion 3a is larger than the support length. If the length of the downstream portion 3a exceeds the support length, the first conveyor 2 starts moving in step S3. In this step, the first conveyor 2 moves toward the downstream side in the transport direction during the process of receiving the printed board 3. Also, control of the rotational speed of the first transport member 2a is started in synchronism with this movement start of the first conveyor 2 (step S4).

The rotational speed of the first transport member 2a is changed from the rotational speed at the first transfer start timing T1 to a predetermined rotational speed for conveyor movement. This rotational speed for conveyor movement is a rotational speed at which the speed of the printed board 3 which advances with respect to a working apparatus 5 by the movement of the first conveyor 2 and the rotation of the first transport member 2a matches the transport speed of the second conveyor 4. In the loading step, as shown in FIG. 13, this rotational speed decreases at the same time the first conveyor 2 starts moving. The ratio (acceleration) at which the rotational speed changes is a ratio corresponding to the acceleration when the first conveyor 2 moves.

The printed board 3 is kept transported even when the first conveyor 2 is moving, and transported to and stopped at a stop position predetermined with respect to the first conveyor 2 (step S5).

After the start of movement, the first conveyor 2 moves to and stops at the working position of the working apparatus 5 (step S6). The loading step is complete when the first conveyor 2 stops at the working position, and a succeeding step begins (step S7).

Figure 12:
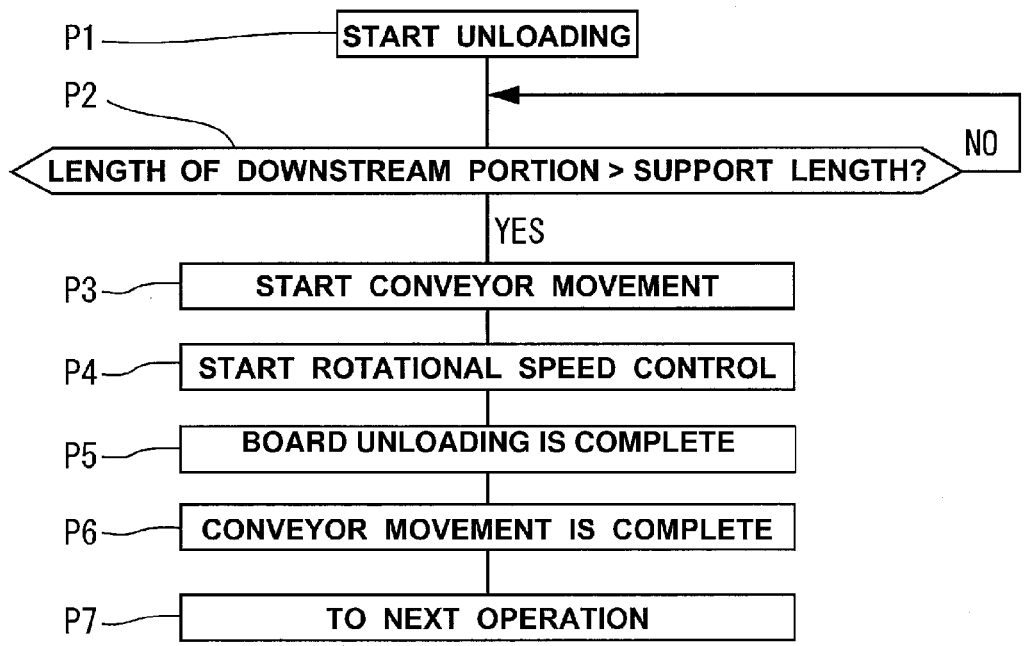
FIG. 12 is a flowchart for explaining the operation of unloading.

In the unloading step, in step P1 of the flowchart shown in FIG. 12, the first conveyor 2 moves to the unloading position under the control of the main control unit 43. In this step, as shown in FIG. 14, the first transport member 2a transports the printed board 3 as well. The first conveyor 2 moves to and stops at the unloading position adjacent to the second conveyor 4 positioned on the unloading portion 8 side. Then, the printed board 3 is transported from the first conveyor 2 to the second conveyor 4 on the downstream side. The downstream edge of the printed board 3 moves onto the second conveyor 4 from the first conveyor 2. When the downstream edge thus moves to the second conveyor 4, the exit-side board sensor 21 senses this downstream edge at the second transfer start timing denoted by reference symbol T2 in FIG. 14, and transmits a signal to the main control unit 43.

The main control unit 43 measures the transport distance of the printed board 3 from the second transfer start timing T2 to the present time. Subsequently, the main control unit 43 determines in step P2 whether the length of the downstream portion 3a, which is obtained by subtracting the above-described gap d from the transport distance of the printed board 3, is larger than the support length. If the length of the downstream portion 3a exceeds the support length, the first conveyor 2 starts moving in step P3. In this step, the first conveyor 2 moves toward the upstream side in the transport direction during the process of transporting the printed board 3 to the second conveyor 4.

Then, control of the rotational speed of the first transport member 2a is started in synchronism with this start of movement of the first conveyor 2 (step P4). In the unloading step, as shown in FIG. 14, the rotational speed of the first transport member 2a rises at the same time the first conveyor 2 starts moving. The ratio (acceleration) at which the rotational speed changes is a ratio corresponding to the acceleration of the first conveyor 2.

The printed board 3 is transferred to the second conveyor 4 as it is kept transported even when the first conveyor 2 is moving, and unloaded (step P5).

The first transport member 2a stops after the whole printed board 3 has left the first conveyor 2.

After the start of movement, the first conveyor 2 returns to a working portion 6 and stops at a predetermined stop position (step P6). The unloading step is complete when the first conveyor 2 thus stops, and a succeeding step begins (step P7).

The main control unit 43 of the printed board transport apparatus 1 according to this embodiment reads out data of the support length of each printed board 3 from the memory 45, and determines whether the length of the downstream portion 3a has reached the support length by using this data. In this embodiment, therefore, even when the printed board 3 to be transported is changed, the first conveyor 2 always starts moving at an optimum timing. Accordingly, this embodiment can provide a printed board transport apparatus which not only shortens the takt time but also increases the reliability of the transport operation.

The main control unit 43 of the printed board transport apparatus 1 according to this embodiment regards the transport distance of the printed board 3, which is obtained by the distance obtaining unit 44 from the transfer start timing to the present time, as the length of the downstream portion 3a.

In this embodiment, the length of the downstream portion 3a of the printed board 3, which is actually placed on a conveyor on the downstream side, can accurately be obtained based on the actual moving distance of the printed board 3.

This makes it possible to precisely determine whether the length of the downstream portion 3a has reached the support length during the process in which the printed board 3 is transferred between conveyors. Therefore, the first conveyor 2 can be operated so as to minimize the transport time.

Accordingly, this embodiment can provide a printed board transport apparatus which further shortens the transport time.

In the printed board transport apparatus 1 according to this embodiment, the printed board loading/unloading portions include the loading portion 7 positioned in one end portion of the working apparatus 5, and the unloading portion 8 positioned in the other end portion of the working apparatus 5. The second conveyor is installed in each of the loading portion 7 and unloading portion 8. Also, the transport direction of the printed board 3 transported by the first conveyor 2 and second conveyors 4 is the direction from the loading portion 7 to the unloading portion 8.

In this embodiment, the takt time required to process one printed board can be shortened in the working apparatus 5 having the structure in which the printed board 3 is transported from one end portion to the other end portion of the working apparatus 5.

In each of the above-described embodiments, the first conveyor 2 moves toward the working portion 6 during the process in which the printed board 3 is transferred between conveyors in both the loading step and unloading step. However, the present disclosure is not limited to this example. That is, the printed board transport apparatus according to the present disclosure can adopt an arrangement in which the first conveyor 2 moves toward the working portion 6 during the process in which the printed board 3 is transferred between conveyors in only one of the loading step and unloading step.

(Other Embodiments)

Figure 15:
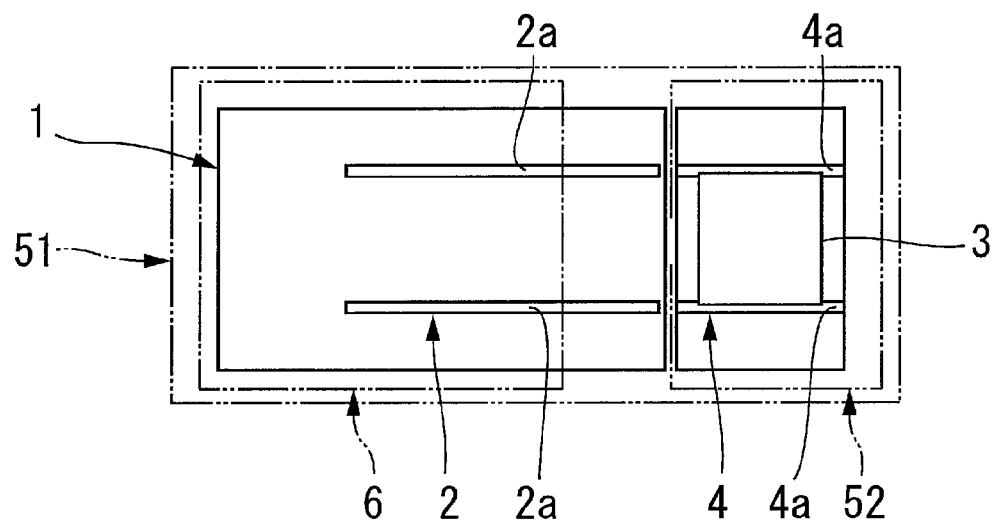
FIG. 15 is a plan view showing the arrangement of a printed board transport apparatus according to another embodiment.
Figure 16:
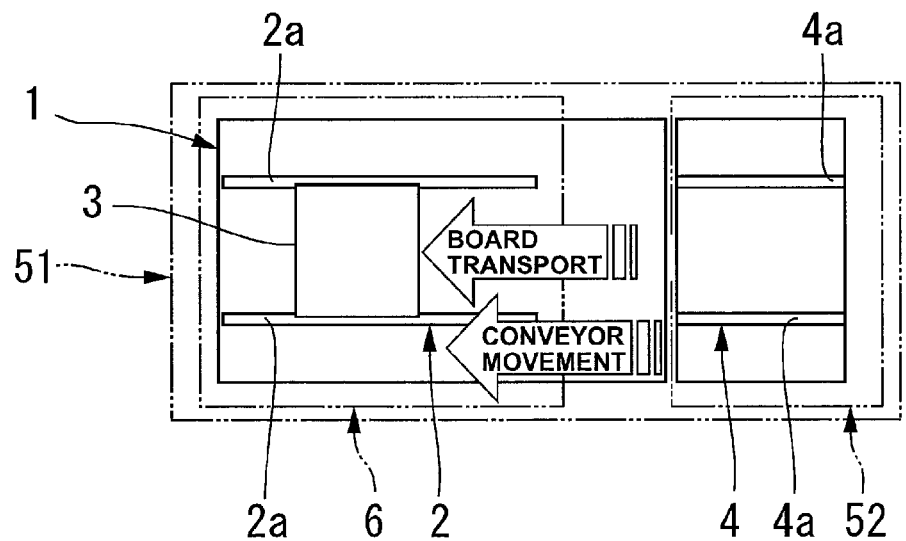
FIG. 16 is a plan view showing the arrangement of the printed board transport apparatus according to the other embodiment.
Figure 17:
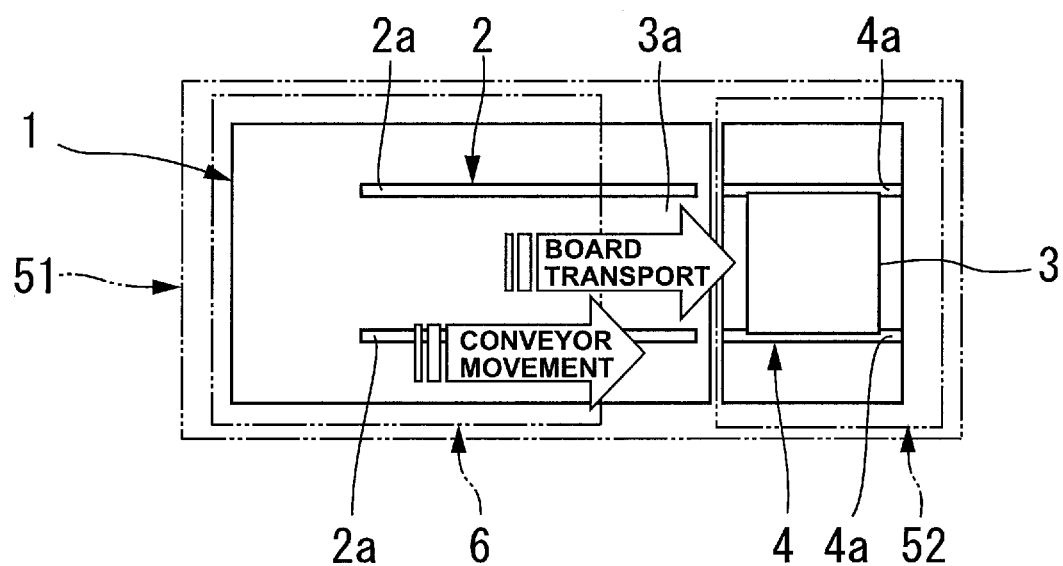
FIG. 17 is a plan view showing the arrangement of the printed board transport apparatus according to the other embodiment.

The printed board transport apparatus according to the present disclosure is not limited to the arrangement which transports a printed board from one end portion to the other end portion of a working apparatus. That is, the printed board transport apparatus 1 according to the present disclosure is also applicable to a working apparatus in which a printed board loading/unloading portion is formed in only one portion as shown in FIGS. 15 to 17. The same reference numerals as in FIGS. 1 to 14 denote the same or similar members in FIGS. 15 to 17, and a detailed explanation thereof will properly be omitted.

A working apparatus 51 according to this embodiment includes a printed board loading/unloading portion 52 in one end portion thereof. Also, a second conveyor 4 of a printed board transport apparatus 1 according to this embodiment is installed in only the printed board loading/unloading portion 52. A first conveyor 2 horizontally moves between a loading/unloading position (see FIGS. 15 and 17) adjacent to the second conveyor 4 and a working position (see FIG. 16) in the working apparatus 51.

As shown in FIGS. 15 and 16, the printed board transport apparatus 1 loads a printed board 3 transported from an apparatus (not shown) in a preceding step into the working apparatus 51 from the printed board loading/unloading portion 52. In this loading step, the first conveyor 2 moves from the loading/unloading position to the working position during a process in which the printed board is transferred from the second conveyor 4 to the first conveyor 2. During this movement, the rotational speed of a first transport member decreases, thereby preventing a slip of the printed board 3.

Also, as shown in FIG. 17, the printed board transport apparatus 1 unloads the printed board 3 having undergone the work to the printed board loading/unloading portion 52 from inside the working apparatus 51. In this step, the rotational direction of a first transport member 2a and a second transport member 4a is opposite to that in the loading step. The unloading step is complete when the printed board is unloaded to the second conveyor 4, and the loading step is started in this state.

Even when adopting this embodiment, the same effect as that obtained when adopting the embodiment shown in FIGS. 1 to 14 is obtained.

The invention claimed is:

1. A printed board transport apparatus comprising:
   a first conveyor installed in a working apparatus for performing work on a printed board, and configured to transport the printed board between a working portion where the working apparatus performs work on the printed board and a printed board loading/unloading portion of the working apparatus; and
   a second conveyor configured to transport the printed board to the first conveyor in a loading step of loading the printed board into the working apparatus through the printed board loading/unloading portion, and receive the printed board from the first conveyor in an unloading step of unloading the printed board from the working apparatus through the printed board loading/unloading portion,
   wherein the first conveyor includes a first transport member on which the printed board is to be placed, and transports the printed board by using both a function of transporting the printed board by rotating the first transport member, and a function of moving between the working portion and the printed board loading/unloading portion in a direction parallel to a transport direction of the printed board,
   the second conveyor includes a second transport member on which the printed board is to be placed, and transports the printed board by rotating the second transport member,
   the printed board is to be transferred from the second conveyor to the first conveyor in the loading step, when the first transport member and the second transport member rotate in the same direction at a predetermined rotational speed in a state in which the first conveyor has moved to and stopped at a position adjacent to the second conveyor, and transferred from the first conveyor to the second conveyor in the unloading step, when the first transport member and the second transport member rotate in the same direction at a predetermined rotational speed in a state in which the first conveyor has moved to and stopped at a position adjacent to the second conveyor, the first conveyor moves toward the working portion in at least one of the loading step and the unloading step by changing a rotational speed of the first transport member from a rotation speed at a conveyor transfer start timing to a predetermined rotational speed for conveyor movement, after a length of a downstream portion of the printed board, which is placed on one of the first conveyor and the second conveyor, which is positioned downstream in the transport direction, has reached a predetermined support length, the support length is a length of a minimum downstream portion with which the printed board placed on one of the first conveyor and the second conveyor positioned downstream in the transport direction does not fall, and the rotational speed for conveyor movement is a rotational speed at which the printed board does not slip with respect to the first transport member and the second transport member.

2. The printed board transport apparatus according to claim 1, further comprising:

a control unit configured to control an operation of the first conveyor; and a memory configured to store the support length, wherein the control unit starts movement of the first conveyor when the length of a downstream portion of the printed board, which is actually placed on one of the first conveyor and the second conveyor, is equal to the support length.

3. The printed board transport apparatus according to claim 2, further comprising:

a detection unit configured to detect a transfer start timing which is a timing at which a downstream edge of the printed board in the transport direction moves onto one of the first conveyor and the second conveyor; and a distance obtaining unit configured to obtain a transport distance of the printed board transported by the first transport member, wherein the control unit obtains the length of the downstream portion of the printed board, which is actually placed on the one conveyor, based on the transport distance obtained by the distance obtaining unit from the transfer start timing to a present time.

4. The printed board transport apparatus according to claim 1, wherein the printed board loading/unloading portion includes a loading portion positioned in one end portion of the working apparatus, and an unloading portion positioned in the other end portion of the working apparatus, the second conveyor is installed for each of the loading portion and the unloading portion, and the transport direction of the printed board transported by the first conveyor and the second conveyor is a direction from the loading portion to the unloading portion.

5. The printed board transport apparatus according to claim 1, wherein the printed board loading/unloading portion is formed in only one end portion of the working apparatus, the transport direction of the printed board transported by the first conveyor and the second conveyor in the loading step is opposite to that of the printed board transported by the first conveyor and the second conveyor in the unloading step, and the first conveyor moves toward the working portion in the loading step by changing the rotational speed of the first transport member from the rotational speed at the transfer start timing to the rotational speed for conveyor movement, after the length of the downstream portion of the printed board, which is placed on the first conveyor has reached the support length.

* * * * *